United States Patent
Sasaki et al.

(10) Patent No.: US 6,542,836 B1
(45) Date of Patent: Apr. 1, 2003

(54) WAVEFORM SIGNAL ANALYZER

(75) Inventors: Keiichi Sasaki, Tokyo (JP); Akira Sawada, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 09/533,937

(22) Filed: Mar. 23, 2000

(30) Foreign Application Priority Data

Mar. 26, 1999 (JP) .......................................... 11-084781

(51) Int. Cl.[7] .............................................. G01R 13/00
(52) U.S. Cl. .................................... 702/66; 375/240.19
(58) Field of Search ............................. 702/66, 70, 73, 702/77; 375/240.19, 240.18, 239

(56) References Cited

U.S. PATENT DOCUMENTS

| | | | |
|---|---|---|---|
| 5,537,344 A | * 7/1996 | Isshiki et al. ................. | 364/725 |
| 5,617,507 A | * 4/1997 | Lee et al. ..................... | 704/200 |
| 5,737,716 A | * 4/1998 | Bergstrom et al. ........... | 704/202 |
| 5,841,890 A | * 11/1998 | Kraske ........................ | 382/131 |
| 5,870,691 A | * 2/1999 | Partyka et al. ................ | 702/16 |
| 5,889,438 A | * 3/1999 | Yamaguchi ................... | 331/17 |
| 6,108,609 A | * 8/2000 | Qian et al. ..................... | 702/66 |
| 6,208,951 B1 | * 3/2001 | Kumar et al. ................. | 702/191 |

FOREIGN PATENT DOCUMENTS

| | | |
|---|---|---|
| JP | 8-95955 | 4/1996 |
| JP | 2735064 | 1/1998 |

OTHER PUBLICATIONS

Keiichi Sasaki, et al. "Application of Wavelet Transform to Analysis of Partial Discharge AE Signals," Proc. of International Workshop on High Voltage Engineering of IEE of Japan, Jan. 1999, pp. 37–42.

* cited by examiner

Primary Examiner—Marc S. Hoff
Assistant Examiner—Paul L Kim
(74) Attorney, Agent, or Firm—Oblon, Spivak, McClelland, Maier & Neustadt, P.C.

(57) ABSTRACT

The waveform signal analyzer of the present invention is equipped with:
  input means 10 that inputs a waveform signals;
  period detection means 20 that detects the period of the waveform signals inputted by input means 10; and
  division means 30 that divides the waveform signals by the period detected by period detection means 20.

Wavelet transformation means 40 performs wavelet transformation of each individual division of the waveform signals. Display means 50 consecutively displays in time series the wavelet transformation results of each individual division of the waveform signals.

18 Claims, 9 Drawing Sheets

WAVEFORM SIGNAL ANALYZER

BACKGROUND OF THE INVENTION

1. Field of the Invention

The present invention relates to waveform signal analyzers that carry out time-frequency analysis by performing wavelet transformation on waveform signals, and more particularly relates to waveform signal analyzers that may detect the periodicity of a waveform signal, divide the waveform signal using those periods and readily compare the wavelet transformation results of the divided waveform signal.

2. Description of the Related Art

The FFT analyzer that performs FFT (Fast Fourier Transformation) on waveform signals is known as an effective prior art of waveform signal analyzer. This is a device that analyzes and displays the frequency components contained in input waveforms as Fourier spectrum strengths, and may check from the Fourier spectrum distribution whether any abnormal frequency components are contained in the input waveforms.

However, since FFT is an analysis method that has no time (phase) information in the transformation results, it is limited to displaying the distribution of the total values of every waveform component contained within an analysis target time for the input waveform, and may not obtain instant of generation information for the various frequency components.

In prior art, when it was wished to know the time series variation of a frequency component, time-frequency analysis was achieved by slicing the waveform that was the target of analysis into extremely small periods of time, using short-time Fourier transformation employing a window function, and displaying the Fourier spectrum at each instant of time arranged in time series along the time axis.

Also, in recent years, wavelet transformation has been proposed and is becoming widespread as a method of time-frequency analysis that may, like short-time Fourier transformation, handle both time information and frequency information.

Wavelet transformation is a signal treatment method that, while independently converting the scale parameter (frequency) and the shift parameter (time) of a location function (that is to say, a localized function) known as the mother wavelet, obtains inner products of the mother wavelet and the target waveform and transforms the target waveform into a time-frequency spectrum.

The advantage of wavelet transformation is that it may find the instants of generation and the strengths of the diverse frequency components present within the target waveform.

As to display methods for the transformation results of wavelet transformation, the time-frequency distribution may be produced as, for example, a three-dimensional display in which the strength axis is raised from a time-frequency plane, or a contour map-like display in which strengths are color-coded step-wise on a time-frequency plane. This type of display is extremely effective for detecting and distinguishing characteristic components of the target waveform.

Here, when the input waveform taken as the target for time-frequency analysis has the characteristic of being synchronized with some pilot signal or other, such as a power source waveform, the correlation between the phase of the pilot signal and the analysis target waveform may be accurately studied by input waveform division and wavelet transformation with the period of that signal. Consequently, it is effective to perform time-frequency analysis by selecting the period of the pilot signal as one interval (one unit) of the analysis time range.

Also, when it is desired to detect abnormalities within the analysis target waveform, an effective method is to carry out respective wavelet transformation of an analysis target waveform that has been continuously divided as stated above and to carry out visual comparison by making those wavelet transformation results visible. As practical methods for rendering visual, such methods may be considered as arranging them as parallel inscriptions or printed matter on the transformation result (graph) display.

However, with such a visualization mode, it is extremely difficult to capture the continuous fluctuation of characteristic peak time series of the wavelet transformation results. Also, when continuously comparing the time series variation, a very wide space is required for the consecutive arrangement of the results.

Moreover, when the period of the pilot signal is not known in advance, it is not possible appropriately to divide the target waveform for time-frequency analysis by wavelet transformation, and thus it is difficult to study the behavior of the characteristic peak time series (that is to say, time sequence) in the wavelet transformation results.

SUMMARY OF THE INVENTION

Accordingly, one objective of the present invention is to provide a novel waveform signal analyzer that may detect the periodicity of an input waveform signal and divide the waveform signal by the relevant period, and may readily compare the time series-wise fluctuations of the wavelet transformation results for the divided waveform signal.

A further objective of the present invention is to provide a waveform signal analyzer that may detect the periodicity of a waveform signal from wavelet transformation results, and may readily compare the time series-wise fluctuations of the wavelet transformation results by dividing the wavelet transformation results by the relevant period.

In order to achieve the above objectives, the present invention is a waveform signal analyzer that comprises:

- an input means for inputting a waveform signal;
- a period detection means for detecting the period of the waveform signal inputted by the input means;
- a division means for dividing the waveform signal based on the period detected by the period detection means;
- a wavelet transformation means for the wavelet-transforming each individual division of the waveform signal; and
- a display means for consecutively displaying in time series the wavelet transformation results of each individual division of the waveform signal.

When using the present invention, the period of the waveform signal is detected by the period detection means, and the waveform signal is divided by that period. Therefore, study of the time series behavior of the characteristic peaks in the wavelet transformation results is simple. Also, when using the present invention, because the wavelet transformation results of each individual division of the waveform signal are consecutively displayed in time series, comparison and examination of wavelet transformation results may be simply performed.

Furthermore, the present invention is a waveform signal analyzer that comprises:

an input means for inputting a waveform signal;

a wavelet transformation means for performing wavelet transformation of the waveform signal inputted by the input means;

a period detection means for detecting the period of transformation results from the wavelet transformation means;

a division means for dividing the transformation results on the basis of the period detected by the period detection means; and a display means for consecutively displaying the divided transformation results in time series.

When using the present invention, because the period of the wavelet transformation results is detected by the period detection means and the wavelet transformation results are divided by that relevant period, study of the time series-wise behavior of characteristic peaks in the wavelet transformation results is simple. Also, when using the present invention, because the divided wavelet transformation results are consecutively displayed in time series, comparison and examination of each divided wavelet transformation result may be simply performed.

BRIEF DESCRIPTION OF THE DRAWINGS

A more complete appreciation of the present invention and many of the attendant advantages thereof will be readily obtained as the same becomes better understood by reference to the following detailed description when considered in connection with the accompanying drawings, wherein.

DETAILED DESCRIPTION OF THE PREFERRED EMBODIMENTS

Referring now to the drawings, wherein like reference numerals designate identical or corresponding parts throughout the several views, and more particularly to FIG. 11 thereof, one embodiment of the present invention will be described.

Figure 1:
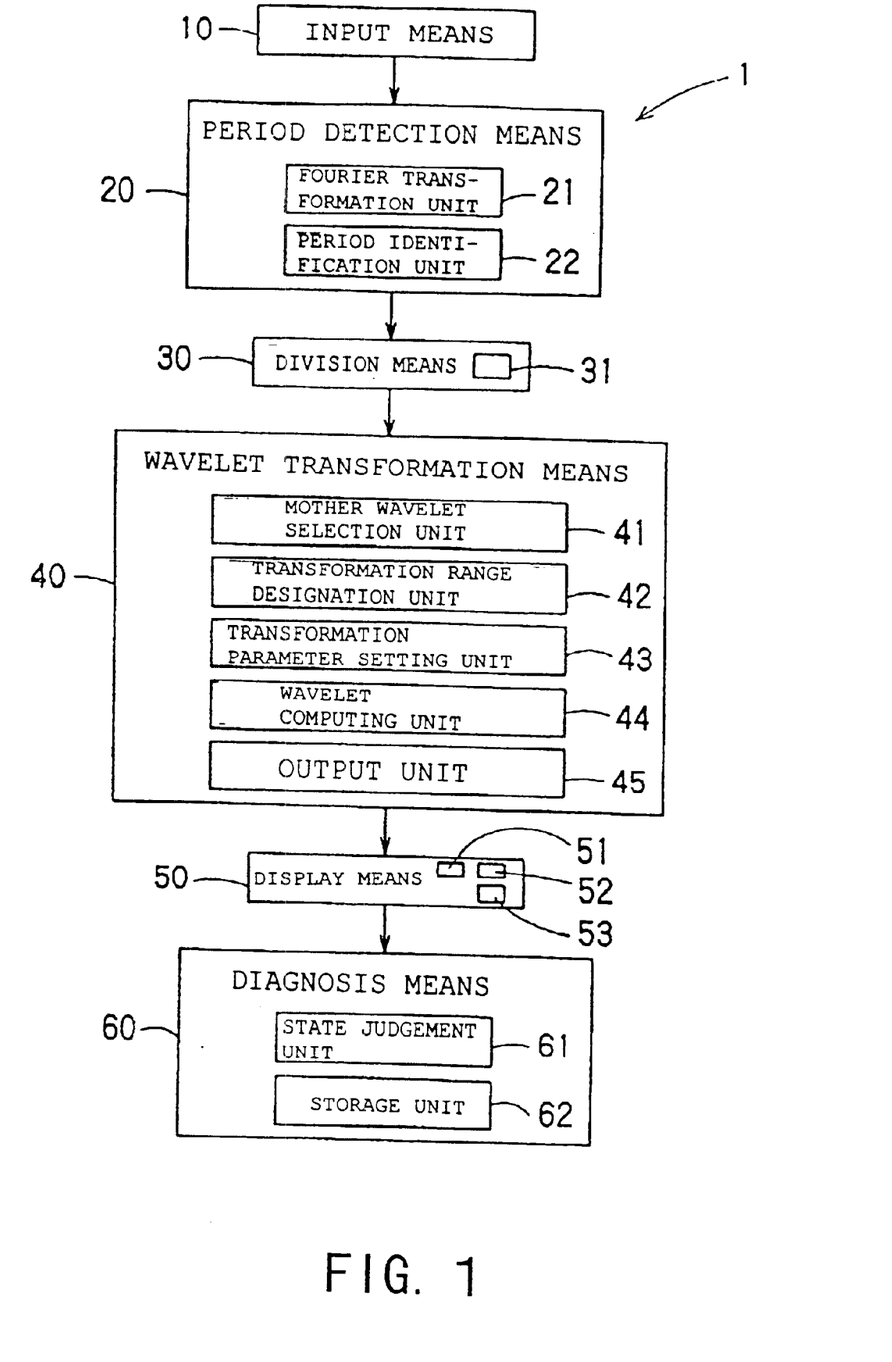
FIG. 1 is a block schematic diagram showing a first embodiment of a waveform signal analyzer concerned in the present invention.

FIG. 1 is a block schematic diagram showing the waveform signal analyzer concerned in a first embodiment of the present invention. As shown in FIG. 1, waveform signal analyzer 1 of the first embodiment of the present invention is equipped with:

input means 10 that inputs the waveform signal;

period detection means 20 that detects the periodicity of the waveform signal inputted by input means 10; and division means 30 that divides the waveform signal using the period detected by period detection means 20.

Period detection means 20 of the present embodiment possesses:

Fourier transformation unit 21 that obtains a Fourier spectrum by performing Fourier transformation on the waveform signal inputted by input means 10; and period identification unit 22 that identifies, from the Fourier spectrum obtained by Fourier transformation unit 21, the peak interval with the greatest strength as the period of the waveform signal.

Also, division means 30 of the present embodiment possesses period setting unit 31 that multiplies the period detected by period detection means 20 by an integer and takes that as the division period. The design is such that the "integer" for this "integer multiplication" is selected at the discretion of the operator.

Wavelet transformation means 40 for the wavelet transformation of each individual division of the waveform signal is connected to division means 30. Display means 50 that consecutively displays in time series (in time sequence) the wavelet transformation results of each individual division of the waveform signal is connected to wavelet transformation means 40.

Wavelet transformation means 40 of the present embodiment possesses:

mother wavelet selection unit 41 that designates the type of mother wavelet;

wavelet transformation range designation unit 42 that designates the time domain that is taken as the wavelet transformation target;

transformation parameter setting unit 43 that sets the scale parameter and the shift parameter for wavelet transformation;

wavelet computing unit 44 that calculates the wavelet coefficient; and output unit 45 that outputs the wavelet transformation results.

Display means 50 of the present embodiment is designed to display the strengths of the wavelet transformation results in different colors for every set numerical range. The design is such that an appropriate multiple of set numerical ranges is determined by the operator, with the result that a contour map-like display is obtained.

Also, display means 50 of the present embodiment is capable of displaying multiple wavelet transformation results by integration in each designated frequency domain.

Moreover, display means 50 of the present embodiment possesses display screen 51 and marker operation unit 52 for designating any position on the display screen. Also, the design is such that, when a wavelet transformation result displayed on display screen 51 has been designated by marker operation unit 52, the time, frequency and strength for that designated wavelet transformation result are displayed on display screen 51.

Also, display means 50 of the present embodiment possesses computing unit 53 that calculates the differences (deviations) and rates of change for wavelet transformation results of differing time series, and the mean of all the transformation results. The design is such that the calculation results from computing unit 53 are displayed on display screen 51.

Moreover, display means 50 of the present embodiment is designed to be capable of displaying "the time variation of peak strength at a designated frequency", which is a cross-section of the wavelet transformation results on the frequency axis, or "the peak strength distribution for each frequency component at a designated moment in time", which is a cross-section on the time axis.

In addition, in waveform signal analyzer 1 of the present embodiment, diagnosis means 60 is connected to display means 50. Diagnosis means 60 possesses storage unit 62, in which a diagnosis algorithm, in which diagnosis targets are determined type by type, is recorded, and state judgement unit 61 that judges the output state of display means 50 using the diagnosis algorithm recorded in storage unit 62. In practice, state judgement unit 61 may judge such things as, for example, the degree of abnormality of the signal source of the analysis target signal. Also, the judgement results may be recorded in storage unit 62.

Figure 2:
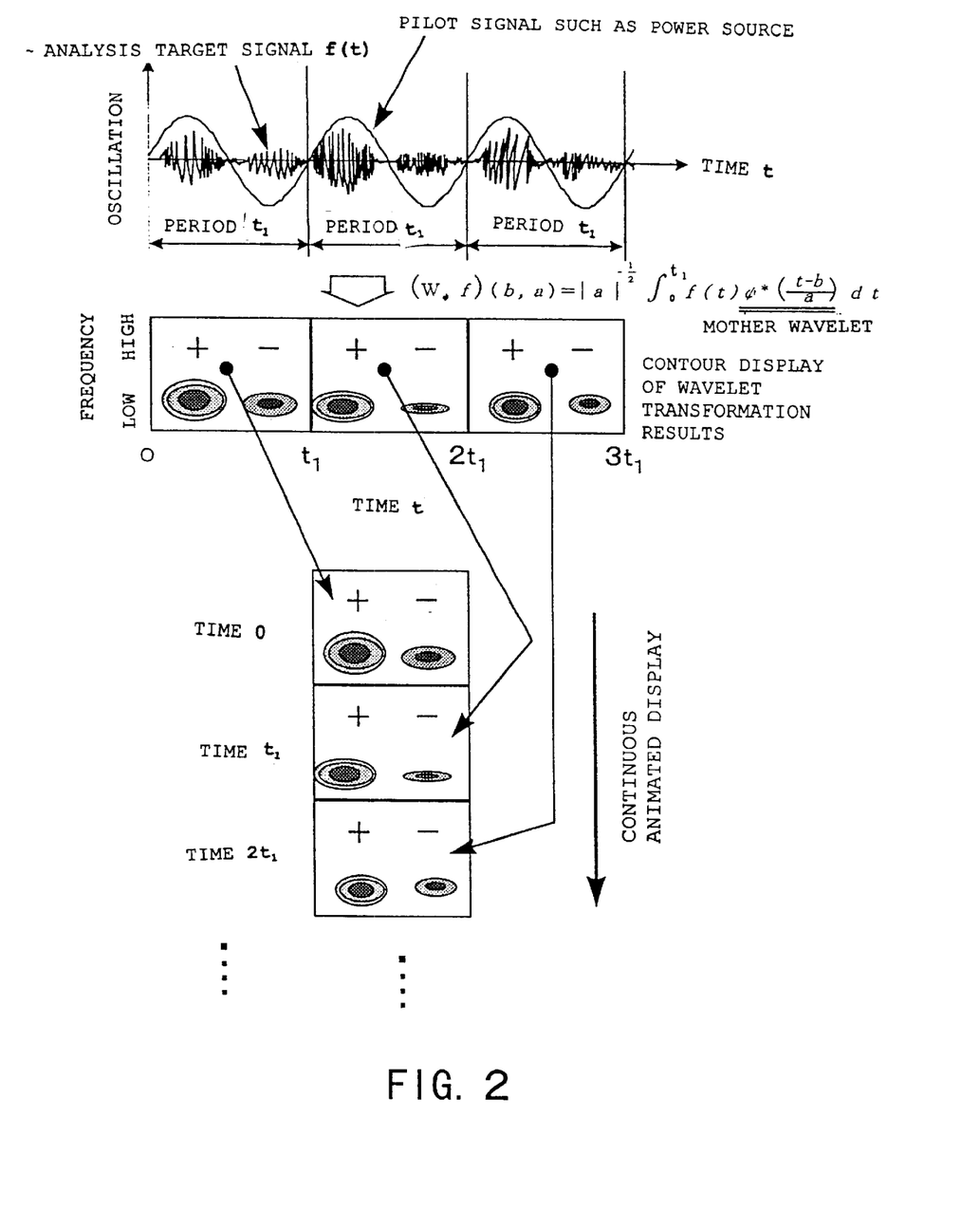
FIG. 2 is a drawing to illustrate the operation of the waveform signal analyzer in FIG. 1.

The following is a description, using FIG. 2, of the operation of a waveform signal analyzer of the present embodiment composed in the above way. FIG. 2 illustrates one example of the operation of waveform signal analyzer 1 of the present embodiment.

First, waveform signal f(t) that will be the subject of analysis is inputted into input means 10.

Next, in period detection means 20, Fourier transformation unit 21 executes Fourier transformation of the inputted waveform signal, and period identification unit 22 identifies the peak interval with the greatest strength from the Fourier spectrum obtained by Fourier transformation unit 21 as the period. In the example shown in FIG. 2, waveform signal f(t) has the characteristic of being synchronized with a pilot signal, such as a power source waveform, and period $t_1$ of the pilot signal is identified as the period of waveform signal f(t).

That is to say, in cases when the period of waveform signal f(t) is not defined beforehand, the period is extracted from the Fourier transformation results of the input waveform signal, but in cases when it is clear that f(t) is synchronized with some pilot signal or other, the period of the pilot signal is applied to period identification unit 22 without the need for Fourier transformation of the input wave signal.

Next, period setting unit 31 of division means 30 defines the division period using integer multiplication of the period set by period identification unit 22. The "integer" for this "integer multiplication" is selected at the discretion of the operator. After the division period has been defined, the analysis target waveform is divided by that division period. In the example shown in FIG. 2, the division period is defined by the equi-multiplication (once times) of identified period $t_1$, and waveform signal f(t) is divided every period $t_1$.

The pilot signal not only provides the period of division, but also in cases when, as shown in FIG. 2, the division instant of the inputted waveform signal is displayed, it performs the division of the inputted waveform signal using that time instant information.

Each individual division of the waveform signal undergoes wavelet transformation by wavelet transformation means 40. The wavelet transformation expression is shown below.

$$(W_\psi f)(b, a) = |a|^{-\frac{1}{2}} \int_0^{\tau_l} f(t) \psi \cdot \left(\frac{t-b}{a}\right) dt$$

In wavelet transformation means 40, at first, mother wavelet selection unit 41 selects mother wavelet $\psi^*((t-b)/a)$ from which it is easy to detect the characteristic of the inputted waveform. Transformation range designation unit 42 designates each division of the inputted waveform. Transformation parameter setting unit 43 appropriately sets the wavelet transformation scale parameter and shift parameter. Then wavelet computing unit 44 calculates the wavelet coefficient, and this is outputted from output unit 45 to display means 50. By this means, time-frequency analysis of each division domain is achieved.

As shown in FIG. 2, each wavelet transformation result, that is to say, the time-frequency analysis result for each division domain, outputted from output unit 45 is screen-displayed (moving displayed) consecutively in time series by display means 50.

Display means 50 of the present embodiment, as shown in FIG. 2, displays the time-frequency analysis results, which are 3-dimensional information, with the strengths in contour map form, divided into different colours for every set numerical value range, on a time-frequency 2-dimensional plane.

Here, the various functions of display means 50 concerned in the present embodiment are described using FIG. 3 to FIG. 6.

As shown in FIG. 3, it is possible for display means 50 of the present embodiment to display multiple wavelet transformation results in combination for every designated frequency domain (the multiple transformation result combined display function). This multiple wavelet transformation result combined display function is effective in the case of dividing simultaneously measured multiple input waveform signals by equal periods and displaying the respective wavelet transformation results in combination.

Figure 3A:
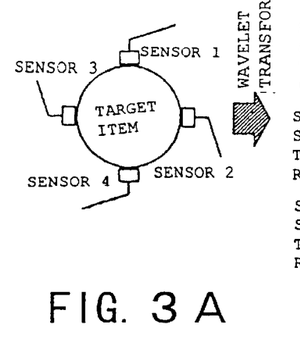
FIG. 3 is a drawing to illustrate the multiple transformation result combined display function of the display means in FIG. 1.
Figure 3B:
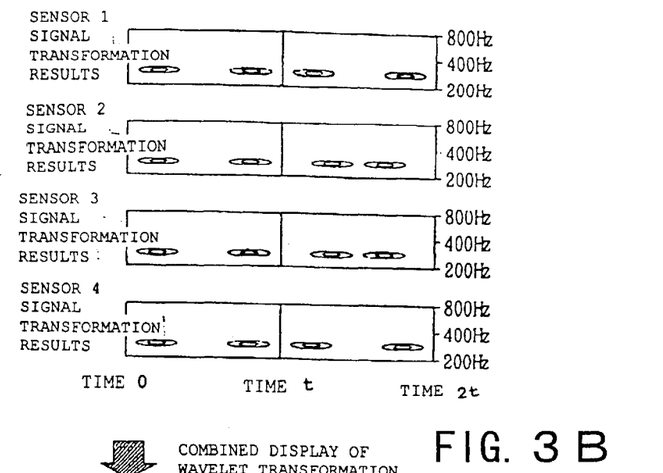

The following is a practical description of the multiple transformation result combined display function, using FIG. 3. As shown in FIG. 3A, sensors 1–4, for example, are mounted on a target item. When the waveform signal generated by that target item is simultaneously measured by each of sensors 1–4, the wavelet transformation results of the respective sensor signals are computed individually, as shown in FIG. 3B.

Figure 3C:
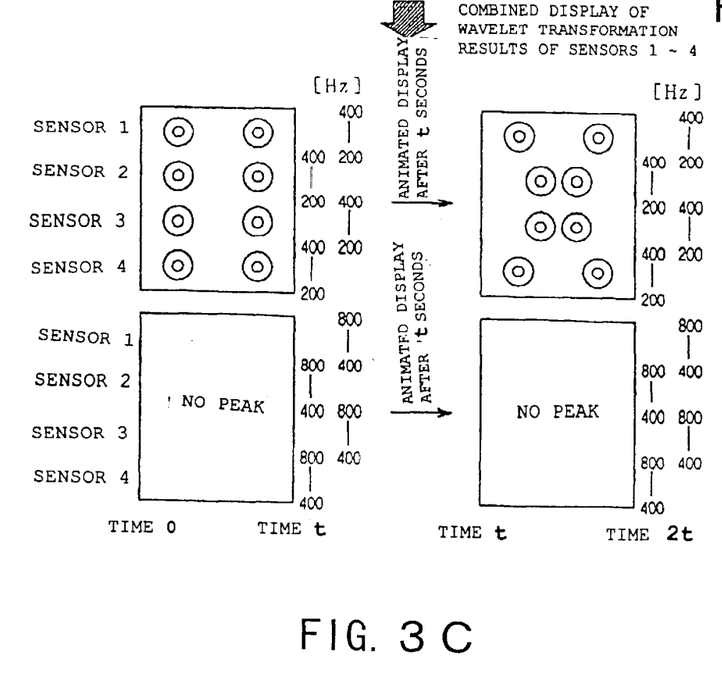

Display means 50 divides the wavelet transformation results at, for example, time instants 0–t and time instants t–2 t of sensors 1–4 into a 200 Hz–400 Hz frequency domain and a 400 Hz–800 Hz frequency domain and, as shown in FIG. 3C, gives a combined display of the respective results. In this case, characteristic contour displays are obtained in the 200 Hz–400 Hz frequency domain, but no peaks are observed in the 400 Hz–800 Hz frequency domain. Also, although the results for time instants 0–t and the results for time instants (that is to say, time) t–2 t are displayed as continuous animation (moving pictures), while the contour map display for the 200 Hz–400 Hz frequency domain changes its display position, no change is observed for the 400 Hz 800 Hz frequency domain.

By the combined display of the wavelet transformation results for multiple signals in this way, it becomes possible to appreciate display information for multiple signals as, so to speak, single display information, and more readily to perform state comparisons and abstraction of characteristics, target by target. Also, it is possible to obtain spatial information for the target item, and effective abridgement of non-essential information, and the like become possible. Furthermore, it is also possible to study relative fluctuation of the time-frequency distribution of multiple input waveform signals, and to find the correlation between input waveforms.

Figure 4:
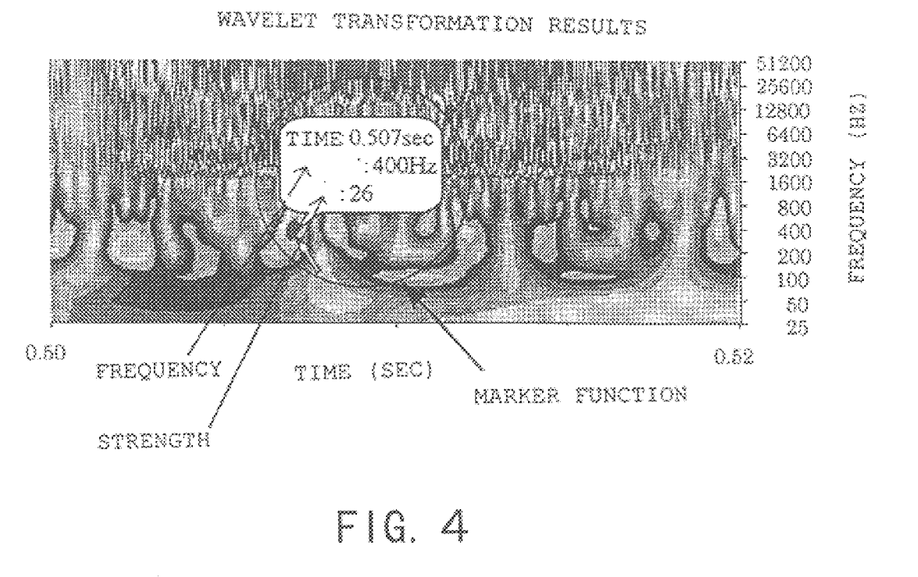
FIG. 4 is a drawing to illustrate the marker function of the display means in FIG. 1.

Also, as shown in FIG. 4, when a wavelet transformation result displayed on display screen 51 is designated by marker operating unit 52, display means 50 of the present embodiment may display the time instant, frequency and strength of that wavelet transformation result in display screen 51 (the marker function).

This marker function is a function that rapidly displays wavelet transformation results and other numerical information in display screen 51. In the example shown in FIG. 4, when the point in display screen 51 on which numerical information is desired is marked with an arrow-shaped pointer by the operation of marker operating unit 52, the details (coordinates, strength, etc.) of the information at the position indicated by the arrow-shaped pointer are promptly displayed in display screen 51.

Using this marker function, it is possible readily to obtain numerical information on the various peaks of the time-frequency distribution obtained by wavelet transformation, for instance time difference (phase difference), strength difference, etc., between peaks.

Figure 5:
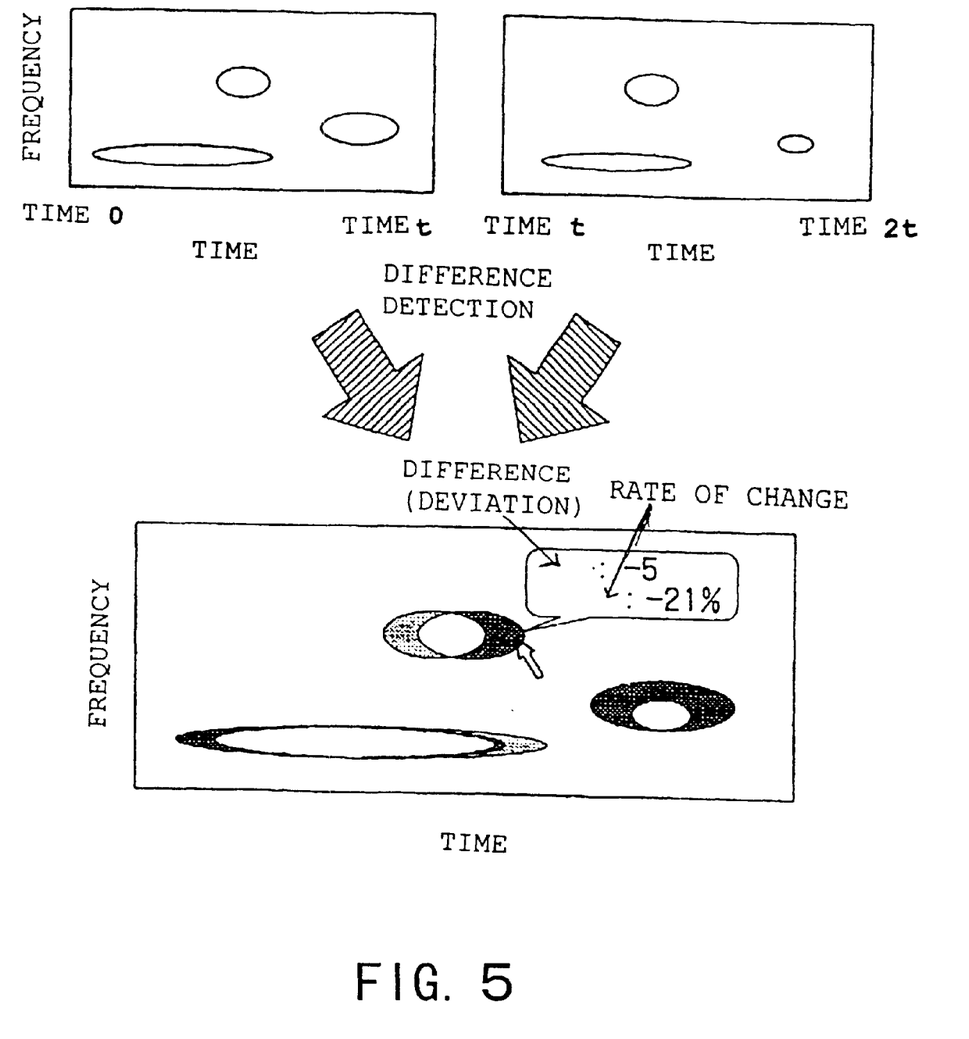
FIG. 5 is a drawing to illustrate the computing function of the display means in FIG. 1.

Furthermore, as shown in FIG. 5, display means 50 may calculate, by computing unit 53, differences, rates of change and, moreover, the mean of the total transformation results, etc., for the wavelet transformation results of a time series, and cause their display in display screen 51 (the computing function).

This computing function is a function that calculates and displays the difference and rate of variation between two images of differing wavelet transformation results, the absolute values of each wavelet transformation result, the mean of the total transformation results, etc. In the example shown in FIG. 5, the difference between the peak strengths of two time-frequency distribution images is taken and displayed, and the rate of variation is calculated and displayed by dividing the difference between the two images by the strength of the image that is earlier time series-wise.

Since, by means of this computing function, it is possible to extract and display characteristics such as the variation with time of wavelet transformation results, analysis of the trend of time-frequency distributions becomes simpler.

Figure 6:
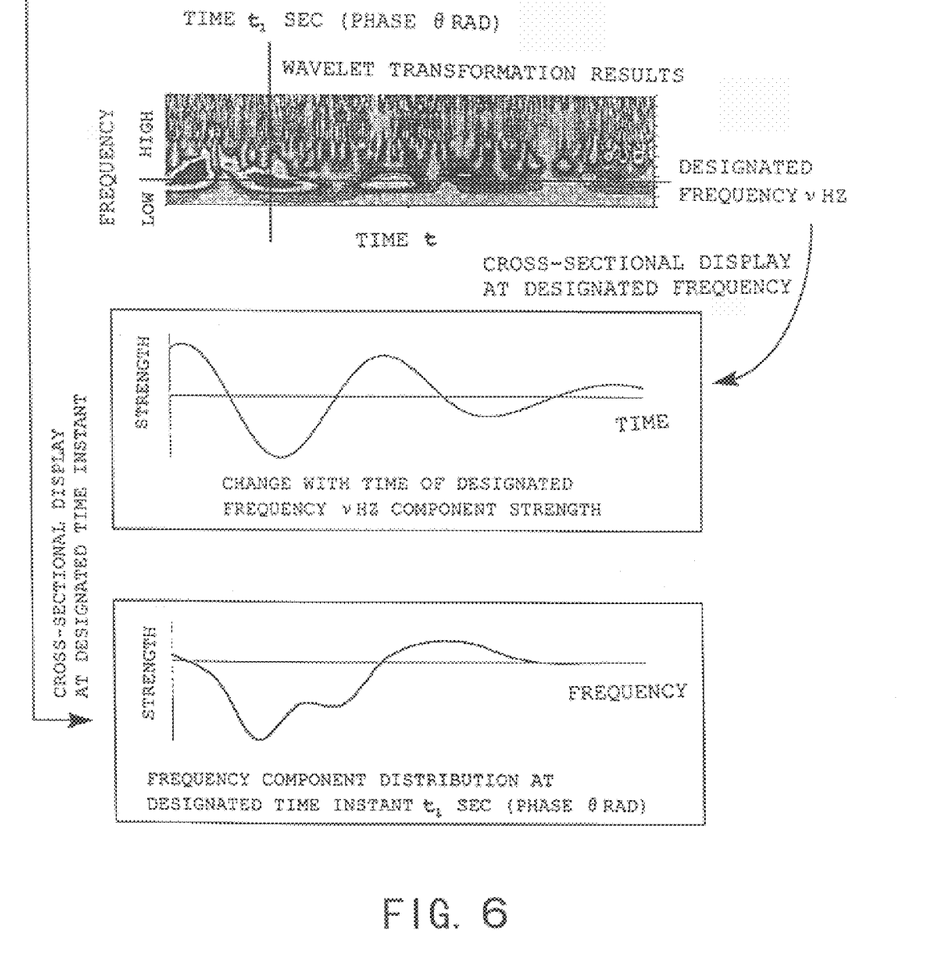
FIG. 6 is a drawing to illustrate the sectional display function of the display means in FIG. 1.

Also, as shown in FIG. 6, display means 50 may display the "variation with time of the peak strength at a designated frequency", which is a cross-section on the frequency axis of the wavelet transformation results, or the "peak strength distribution of each frequency component at a designated moment in time", which is a cross-section on the time axis (cross-sectional display function).

This cross-sectional display function is a function that displays cross-sections on the frequency axis or cross-sections on the time axis of the wavelet transformation results. As shown in the examples in FIG. 6, it displays "the variation with time of designated frequency v Hz component strength" or "the peak strength distribution of the frequency component at designated time $t_1$ sec (phase θ rad)".

This cross-sectional display function, too, is effective for the trend analysis of time-frequency distributions.

Based on the analysis results displayed by display means 50, diagnosis means 60 judges any abnormality of the transmission source of the waveform signal. In practice, using a diagnosis algorithm determined from every type of diagnosis subject recorded in storage unit 62, state judgement unit 61 judges the analysis results outputted by display means 50. The judgement result is recorded in storage unit 62.

When using the present embodiment as above, because the period of the waveform signal is detected by period detection means 20 and the waveform signal f(t) is divided by that period, it is simple to study the time series-wise behavior of characteristic peaks in the wavelet transformation results.

Also, when using the present embodiment, because the wavelet transformation results for the individual divisions of the waveform signal are displayed consecutively in time series by display means 50, comparison and investigation of the wavelet transformation results may readily be performed.

Again, when using the present embodiment, since a time domain that is once displayed may be broadened while preserving the periodicity by means of period setting unit 31, it is also possible to make a general analysis of the time series variations of the analysed time-frequency distribution.

Moreover, when using the present embodiment, since the most effective mother wavelet function for time-frequency analysis of the analysis target waveform may be selected by mother wavelet transformation means 40, the sensitivity of extraction of the characteristic components within the time-frequency distribution may be heightened. Also, since the transformation time range and the scale parameter and shift parameter may freely be altered, it is possible to design optimisation of the amount of calculation in the computation of the mother wavelet coefficient.

Furthermore, display means 50 of the present embodiment is supplemented by such above-stated beneficial functions. Thus, a display may be achieved with which characteristic extraction and trend analysis of the peaks of wavelet transformation results may readily be performed and judgement of abnormalities and the like contained in the analyzed waveform is simple.

Still further, with waveform signal analyzer 1 of the present embodiment it is possible to judge whether the state of the waveform signal is normal or abnormal, define the abnormality mode,, judge the degree of abnormality, etc., using diagnosis means 60. Also, by compiling the required database within storage unit 62, it is possible to expand the abnormality diagnosis targets due to the waveform signal.

Incidentally, period detection means 20 may possess a function such as detection of the peak values of the input waveform signal, instead of possessing Fourier transformation unit 21. In such a case, it is possible to set the optimum division period for the animated display of the wavelet transformation results from the interval between peak values.

Figure 7:
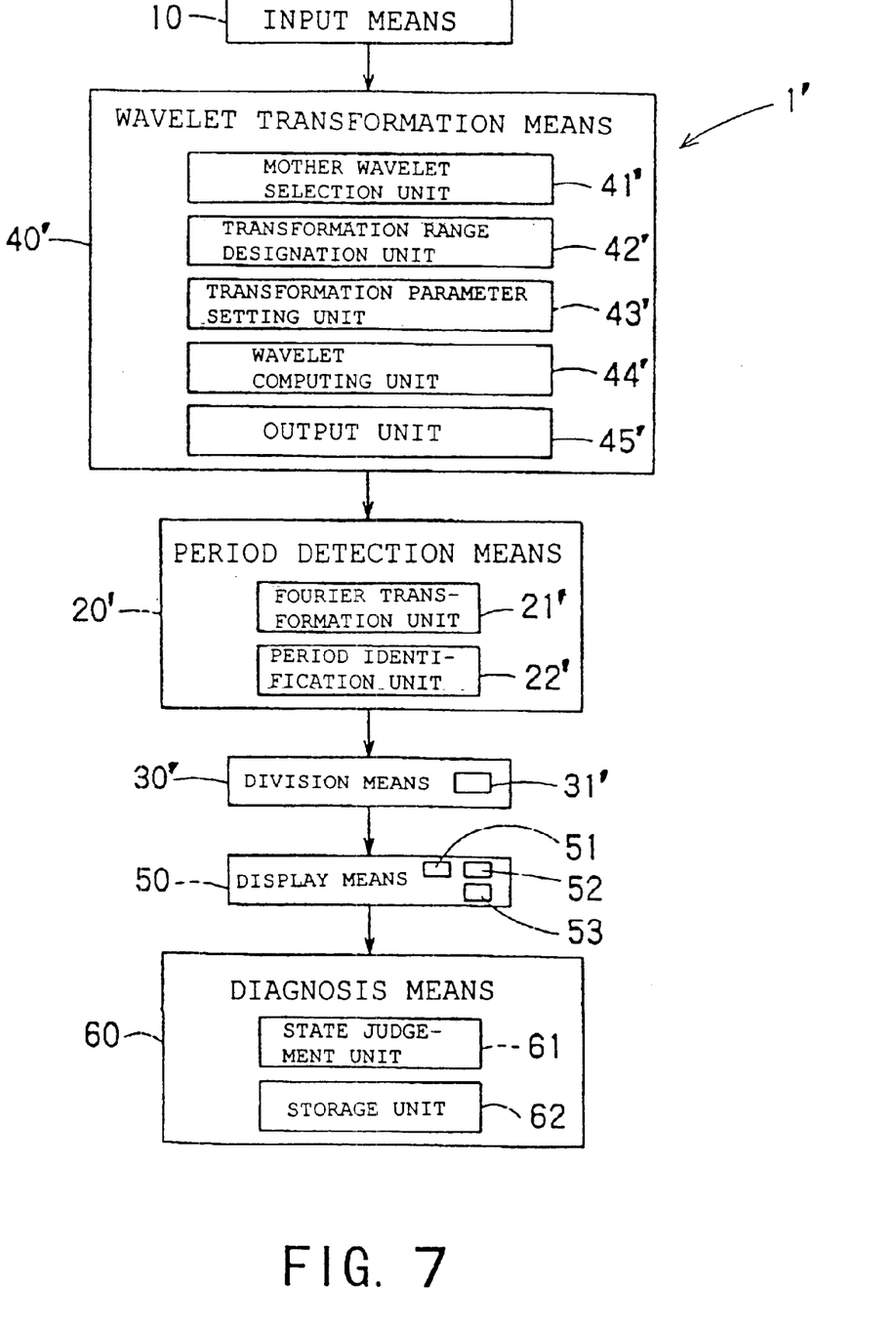
FIG. 7 is a block schematic diagram showing a second embodiment of a waveform signal analyzer concerned in the present invention.

The following is a description of the waveform signal analyzer of a second embodiment of the present invention, using FIG. 7. FIG. 7 is a schematic block diagram of the waveform signal analyzer of the second embodiment.

As shown in FIG. 7, in waveform signal analyzer 1', wavelet transformation means 40' is connected directly to input means 10, and is designed to perform wavelet transformation of the waveform signal inputted from input means 10 as it stands. Period detection means 20' is designed to detect the periodicity, not of the input waveform signal, but of the transformation results from wavelet transformation means 40'. Division means 30' is designed to divide, not the inputted waveform signal, but the transformation results by the period detected by period detection means 20'.

The rest of the composition is the same composition as that of the first embodiment shown in FIG. 1. In the second embodiment, parts that are the same as in the first embodiment shown in FIG. 1 have been assigned like reference numerals, and their descriptions have been omitted.

Period detection means 20' possesses, for instance:

Fourier transformation unit 21' that obtains a Fourier spectrum by performing Fourier transformation of the wavelet transformation results; and period identification unit 22' that identifies, from the Fourier spectrum obtained by Fourier transformation unit 21', its strongest peak interval as the division period.

Figure 8:
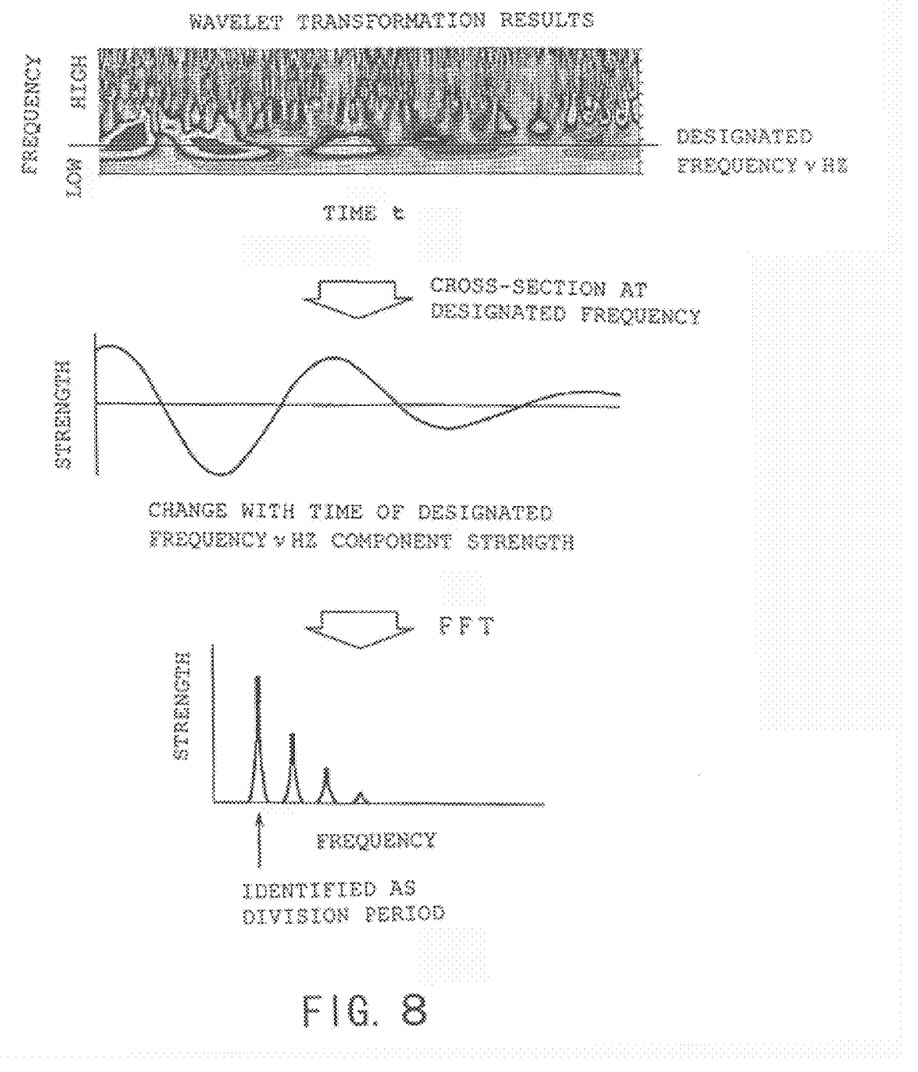
FIG. 8 is a drawing to illustrate the operation of an example of the period detection means in FIG. 7.

In practice, as shown in FIG. 8, Fourier transformation unit 21' designates characteristic designated frequency v Hz (for instance, a frequency in which it is considered peaks often appear), based on the wavelet transformation results, and performs Fourier transformation (FFT) for that time variation. Period identification unit 22' identifies the division period from that result.

Figure 9:
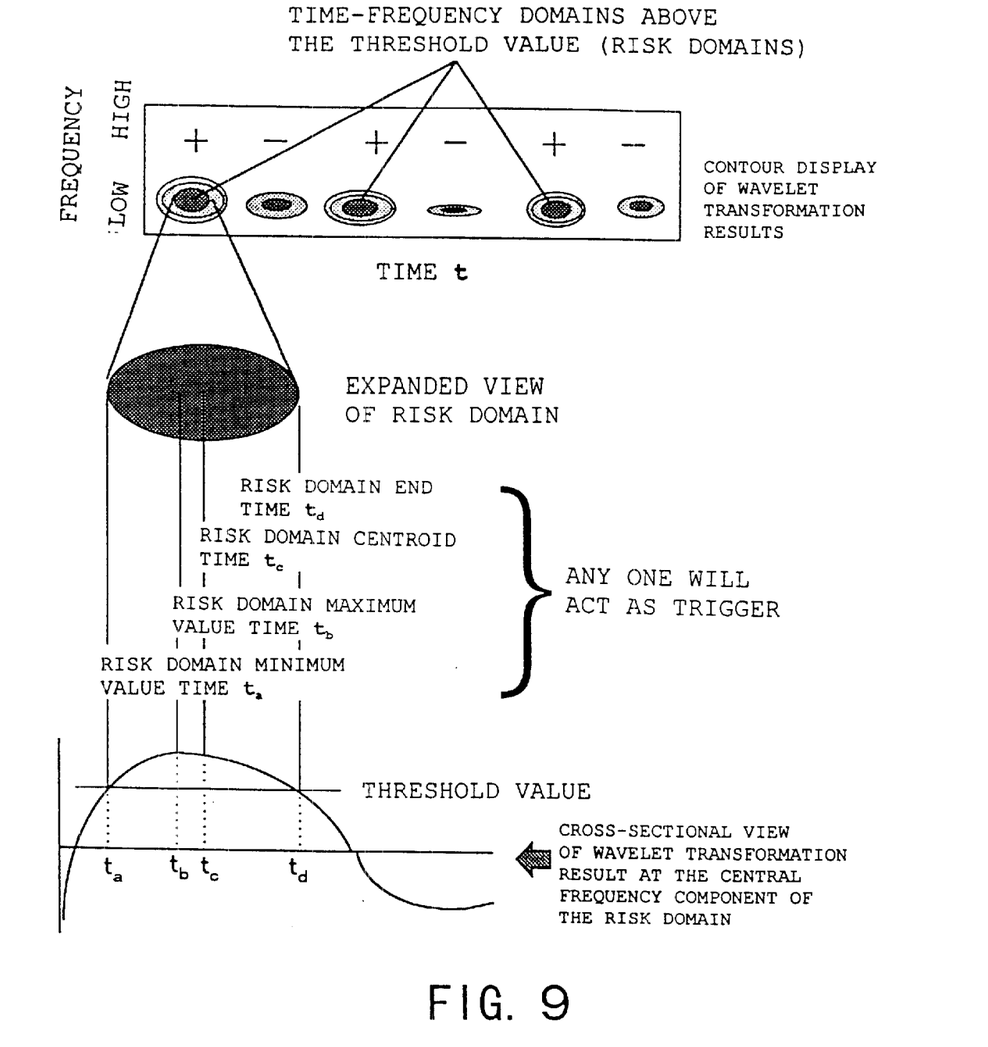
FIG. 9 is a drawing to illustrate the operation of another example of the period detection means in FIG. 7.

Alternatively, period detection means 20', as shown in FIG. 9, may detect maximum value $t_b$ and the minimum value, centroid $t_c$ and moment of commencement of designated domain ta or moment of completion of designated domain $t_d$ in a designated time-frequency domain in the wavelet transformation results, for instance a time-frequency domain in which the peak strength exceeds the designated threshold value (risk domain), and obtain the division period from this. In this case, the division period sometimes becomes an indefinite period.

When using the present embodiment, because the period of the wavelet transformation results is detected by period detection means 20' and the wavelet transformation results are divided by that period, study of the time series behavior of characteristic peaks in the wavelet transformation results is simple.

Also, when using the present embodiment, because the divided wavelet transformation results are consecutively displayed in time series, investigation of the wavelet transformation results may readily be performed.

When using the present invention, because the periodicity of the waveform signal is detected by the period detection means and the waveform signal is divided by that period, study of the time series behavior of characteristic peaks in the wavelet transformation results is simple. Also, when using the present invention, because the wavelet transformation results of each individual division of the waveform signal are consecutively displayed in time series, investigation of the wavelet transformation results may readily be performed.

Moreover, when using the present invention, because the periodicity of the wavelet transformation results is detected by the period detection means and the wavelet transformation results are divided by that period, study of the times series behavior of characteristic peaks in the wavelet transformation results is simple. Also, when using the present invention, because the divided wavelet transformation results are consecutively displayed in time series, investigation of the wavelet transformation results may readily be performed.

Obviously numerous additional modifications and variations of the present invention are possible in light of the above teachings. It is therefore to be understood that, within the scope of the appended claims, the present invention may be practised otherwise than as specially described herein.

What is claimed is:

1. A waveform signal analyzer, comprising:
   an input means for inputting waveform signals;
   a period detection means for detecting a periodicity of said waveform signals inputted by said input means;
   a division means for dividing said waveform signals based on said periodicity detected by said period detection means;
   a wavelet transformation means for wavelet-transforming each individual division of said waveform signals; and
   a display means for consecutively displaying in time series said wavelet transformation results of each individual division of said waveform signals.

2. A waveform signal analyzer according to claim 1, wherein: said wavelet transformation means has a mother wavelet selection unit that designates a type of mother wavelet;
   a transformation range designation unit that designates a time domain that is taken as a target for wavelet transformation;
   a transformation parameter setting unit that sets scale parameters and shift parameters for wavelet transformation;
   a wavelet computing unit that calculates wavelet coefficients; and
   an output unit that outputs wavelet transformation results.

3. A waveform signal analyzer according to claim 1 or claim 2, wherein: said period detection means has
   a Fourier transformation unit that performs Fourier transformation on said waveform signals inputted by said input means and obtains a Fourier spectrum; and
   a period identification unit that identifies said period of said waveform signals from said Fourier spectrum obtained by said Fourier transformation unit.

4. A waveform signal analyzer according to claim 1, wherein said division means comprises:
   a period setting unit that sets a division period by using one of (1) an integer multiplication of said period detected by said period detection means and (2) a period of a pilot signal that is pre-synchronized with said inputted waveform signals; and
   means for setting a division position using said pilot signal, when the division period is set using the period of the pilot signal.

5. A waveform signal analyzer according to claim 1, wherein said display means further comprises:
   means for outputting wavelet transformation results using different colors for each numerical range of wavelet strength.

6. A waveform signal analyzer according to claim 1, wherein said display means further comprises:
   means for combining a plurality of wavelet transformation results according to designated frequency domains.

7. A waveform signal analyzer according to claim 1, wherein said display means comprises:
   a marker operating unit for designating desired portions on a display screen, and, when a wavelet transformation result is designated on said display screen by said marker operating unit, said display means displays time, frequency, and strength of said wavelet transformation result on said display screen.

8. A waveform signal analyzer according to claim 1, wherein said display means further comprises:
   a computing unit that computes (1) differences and variation rates of different wavelet transformation results and (2) a mean of all said transformation results.

9. A waveform signal analyzer according to claim 1, wherein said display means further comprises:
   means for displaying one of (1) said time variation of peak strengths in a designated frequency, which is a cross-section of said wavelet transformation results on a frequency axis and (2) a peak strength distribution of each frequency component at a designated moment in time, which is a cross-section on a time axis.

10. A waveform signal analyzer according to claim 2, wherein said division means comprises:
    a period setting unit that sets a division period by using one of (I) an integer multiplication of said period detected by said period detection means and (2) a period of a pilot signal that is pre-synchronized with said inputted waveform signals; and means for setting a division position using said pilot signal, when the division period is set using the period of the pilot signal.

11. A waveform signal analyzer according to claim 2, wherein said display means further comprises:

means for outputting wavelet transformation results using different colors for each numerical range of wavelet strength.

12. A waveform signal analyzer according to claim 2, wherein said display means further comprises:

means for combining a plurality of wavelet transformation results according to designated frequency domains.

13. A waveform signal analyzer according to claim 2, wherein said display means comprises:

a marker operating unit for designating desired portions on a display screen, and, when a wavelet transformation result is designated on said display screen by said marker operating unit, said display means displays time, frequency, and strength of said wavelet transformation result on said display screen.

14. A waveform signal analyzer according to claim 2, wherein said display means further comprises:

a computing unit that computes (1) differences and variation rates of different wavelet transformation results and (2) a mean of all said transformation results.

15. A waveform signal analyzer according to claim 2, wherein said display means further comprises:

means for displaying one of (1) said time variation of peak strengths in a designated frequency, which is a cross-section of said wavelet transformation results on a frequency axis and (2) a peak strength distribution of each frequency component at a designated moment in time, which is a cross-section on a time axis.

16. A waveform signal analyzer, comprising:

an input means for inputting waveform signals;

a wavelet transformation means for performing wavelet transformation of waveform signals inputted by said input means;

a period detection means for detecting a periodicity of results of transformation by said wavelet transformation means;

a division means for dividing said transformation results, based on said periodicity detected by said period detection means; and a display means for consecutively displaying said divided transformation results in time series.

17. A waveform signal analyzer according to claim 16, wherein: said period detection means has a Fourier transformation unit that performs Fourier transformation of said wavelet transformation results and obtains a Fourier spectrum; and a period identification unit that identifies said period of said transformation results from said Fourier spectrum obtained by said Fourier transformation unit.

18. A waveform signal analyzer according to claim 8, wherein:

said period detection means has a function of being designed to detect a maximum value and a minimum value within a designated time-frequency domain, a centroid and a designated domain start time or a designated domain end time in said wavelet-transformation results.

* * * * *